(12) United States Patent
Peng et al.

(10) Patent No.: US 10,957,729 B2
(45) Date of Patent: Mar. 23, 2021

(54) IMAGE SENSOR WITH EMBEDDED LIGHT-MEASURING PIXELS AND METHOD OF AUTOMATIC EXPOSURE CONTROL USING THE SAME

(71) Applicant: MEDIATEK INC., Hsin-Chu (TW)

(72) Inventors: Chi-Hsiang Peng, Taoyuan (TW); Po-Min Wang, Kaohsiung (TW)

(73) Assignee: MEDIATEK INC., Hsinchu (TW)

( * ) Notice: Subject to any disclaimer, the term of this patent is extended or adjusted under 35 U.S.C. 154(b) by 85 days.

(21) Appl. No.: 16/383,920

(22) Filed: Apr. 15, 2019

(65) Prior Publication Data

US 2020/0328242 A1 Oct. 15, 2020

(51) Int. Cl.
*H01L 27/146* (2006.01)
*H04N 5/225* (2006.01)
*H04N 5/235* (2006.01)
*H04N 5/232* (2006.01)

(52) U.S. Cl.
CPC .. *H01L 27/14621* (2013.01); *H01L 27/14625* (2013.01); *H04N 5/2254* (2013.01); *H04N 5/2353* (2013.01); *H04N 5/23229* (2013.01)

(58) Field of Classification Search
CPC .......... G03B 7/00; G03B 7/08; H04N 5/2353; H04N 5/23229; H04N 5/351; H01L 27/14621; H01L 27/14625
See application file for complete search history.

(56) References Cited

U.S. PATENT DOCUMENTS

| | | | |
|---|---|---|---|
| 8,446,481 B1 * | 5/2013 | Geiss | H04N 5/265 348/221.1 |
| 8,779,341 B2 | 7/2014 | Mine | |
| 9,232,149 B2 | 1/2016 | Tomaszewski et al. | |
| 9,615,020 B2 | 4/2017 | Tsai | |
| 2016/0373664 A1 | 12/2016 | Wei | |
| 2019/0037119 A1 | 1/2019 | Uchida | |

FOREIGN PATENT DOCUMENTS

TW 201634999 A 10/2016

* cited by examiner

*Primary Examiner* — Minh Q Phan
(74) *Attorney, Agent, or Firm* — McClure, Qualey & Rodack, LLP

(57) ABSTRACT

An apparatus is provided. The apparatus includes: a processor configured to perform operations including the steps of: receiving, from a sensor array of an image sensor, data sensed by the sensor array, the sensed data comprising image data and ambient light information; determining whether the image data matches a predetermined exposure criterion; and in response to the image data not matching the predetermined exposure criterion, obtaining the ambient light information from the sensed data; and selectively configuring a new exposure value for a plurality of imaging pixels in the image sensor to capture new image data according to the obtained ambient light information.

18 Claims, 12 Drawing Sheets

| G | B |
|---|---|
| R | G |

FIG. 1

IMAGE SENSOR WITH EMBEDDED LIGHT-MEASURING PIXELS AND METHOD OF AUTOMATIC EXPOSURE CONTROL USING THE SAME

BACKGROUND OF THE DISCLOSURE

Field of the Disclosure

The disclosure relates to an image sensor, and, in particular, to an apparatus including an image sensor with embedded light-measuring pixels and a method of automatic exposure control (AEC) for a camera using the same.

Description of the Related Art

People are increasingly utilizing portable computing devices for a variety of tasks. Some of these tasks involve the capture of one or more images, or video, using at least one camera of a computing device. In order to obtain images of an acceptable quality, such as images with appropriate levels of brightness or contrast, various computing devices can utilize an exposure control algorithm to attempt to adjust the exposure of the camera capturing the image. In conventional approaches, the algorithm is executed on a main processor of the device, and several iterations can be necessary to get to an appropriate exposure setting for current conditions. The latency introduced by each iteration can degrade the user experience. Further, the amount of power and resources needed to determine the appropriate exposure setting can be significant, which can be particularly undesirable for portable computing devices with limited battery life or processing capability.

BRIEF SUMMARY OF THE DISCLOSURE

A detailed description is given in the following embodiments with reference to the accompanying drawings.

An apparatus is provided. The apparatus includes: a processor configured to perform operations including the steps of: receiving, from a sensor array of an image sensor, data sensed by the sensor array, the sensed data comprising image data and ambient light information; determining whether the image data matches a predetermined exposure criterion; and in response to the image data not matching the predetermined exposure criterion, obtaining the ambient light information from the sensed data; and selectively configuring a new exposure value for a plurality of imaging pixels in the image sensor to capture new image data according to the obtained ambient light information.

A method of automatic exposure control (AEC) for a camera is provided. The camera comprises the above-mentioned image sensor. The method includes the steps of: receiving, from a sensor array of the image sensor, data sensed by the sensor array, the sensed data comprising image data and ambient light information; determining whether the image data matches a predetermined exposure criterion; in response to the image data not matching the predetermined exposure criterion, obtaining the ambient light information from the sensed data; and selectively configuring a new exposure value for a plurality of imaging pixels in the image sensor to capture new image data according to the obtained ambient light information.

BRIEF DESCRIPTION OF THE DRAWINGS

The disclosure can be more fully understood by reading the subsequent detailed description and examples with references made to the accompanying drawings, wherein:

FIG. 1 is an example of the Bayer pattern;

DETAILED DESCRIPTION OF THE DISCLOSURE

The following description is made for the purpose of illustrating the general principles of the disclosure and should not be taken in a limiting sense. The scope of the disclosure is best determined by reference to the appended claims.

Figure 1:
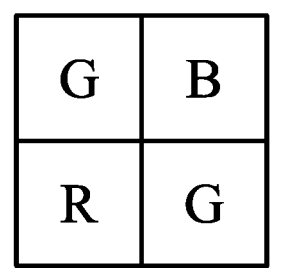
Figure 2:
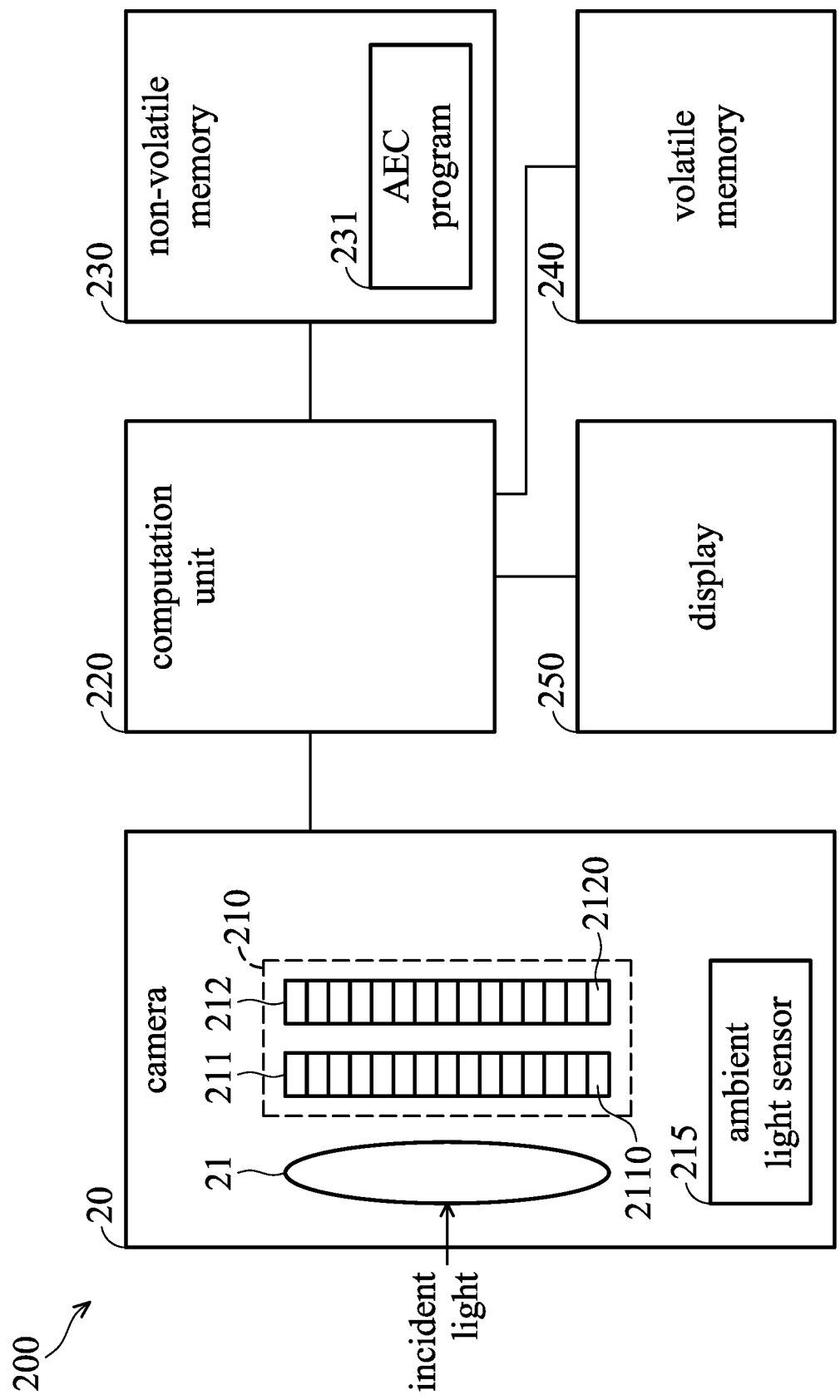
FIG. 2 is a block diagram of an electronic device in accordance with an embodiment of the disclosure.

FIG. 2 is a block diagram of an electronic device in accordance with an embodiment of the disclosure. As illustrated in FIG. 2, the electronic device 200 includes a camera 20, a computation unit 220, a non-volatile memory 230, a volatile memory 240, and a display 250. The camera 20 includes a lens 21, an image sensor 210, and an ambient light sensor 215. The image sensor 210 includes a filter array 211 and a sensor array 212. The filter array 211 has a plurality of filters 2110 arranged in a two-dimensional manner. The filters 2110 may include red filters, green filters, and blue filters. For example, one red filter, two green filters, and one blue filter may form a Bayer pattern (e.g., shown in FIG. 1) that is a 2x2 color filter array repeatedly arranged in the filter array 211. In some embodiments, the red filters, green filters, and blue filters may be arranged in any form of color filter arrays well-known to a person skilled in the art.

The sensor array 212 may include a plurality of photosensitive elements 2120 arranged in a two-dimensional manner, and the plurality of photosensitive elements and the plurality of filters 2110 may be arranged in a one-to-one correspondence. The sensor array 212 may receive incident light via the lens 21 and the filter array 211. A single photosensitive element 1120 with its associated color filter can be regarded as a pixel.

The ambient light sensor (ALS) 215 is configured to detect ambient light around the electronic device 200. For example, the ALS 215, which can be a single value photodetector or photodiode, may provide measurements of ambient light intensity which match the human eye's response to light under a variety of lighting conditions. In an embodiment, the ambient light sensor 215 is a standalone light sensor external to the image sensor 210. In some embodiments, the ambient light sensor 215 is external to the camera 20.

The computation unit 220 may be an application processor or host processor such as a central processing unit (CPU) for loading instructions such as an auto exposure control (AEC) program 231 from the non-volatile memory 230 to the volatile memory 240 for execution.

As would be apparent to one of ordinary skill in the art, the electronic device 200 can include many types of memory, data storage or computer-readable storage media, such as non-volatile memory 230 for program instructions for execution by the computation unit 220, the same or separate storage can be used for images or data, a removable storage memory can be available for sharing information with other devices, etc.

The display 250 may be implemented by various display technologies such as a touch screen, electronic ink (e-ink), organic light emitting diode (OLED) or liquid crystal display (LCD).

Figure 3:
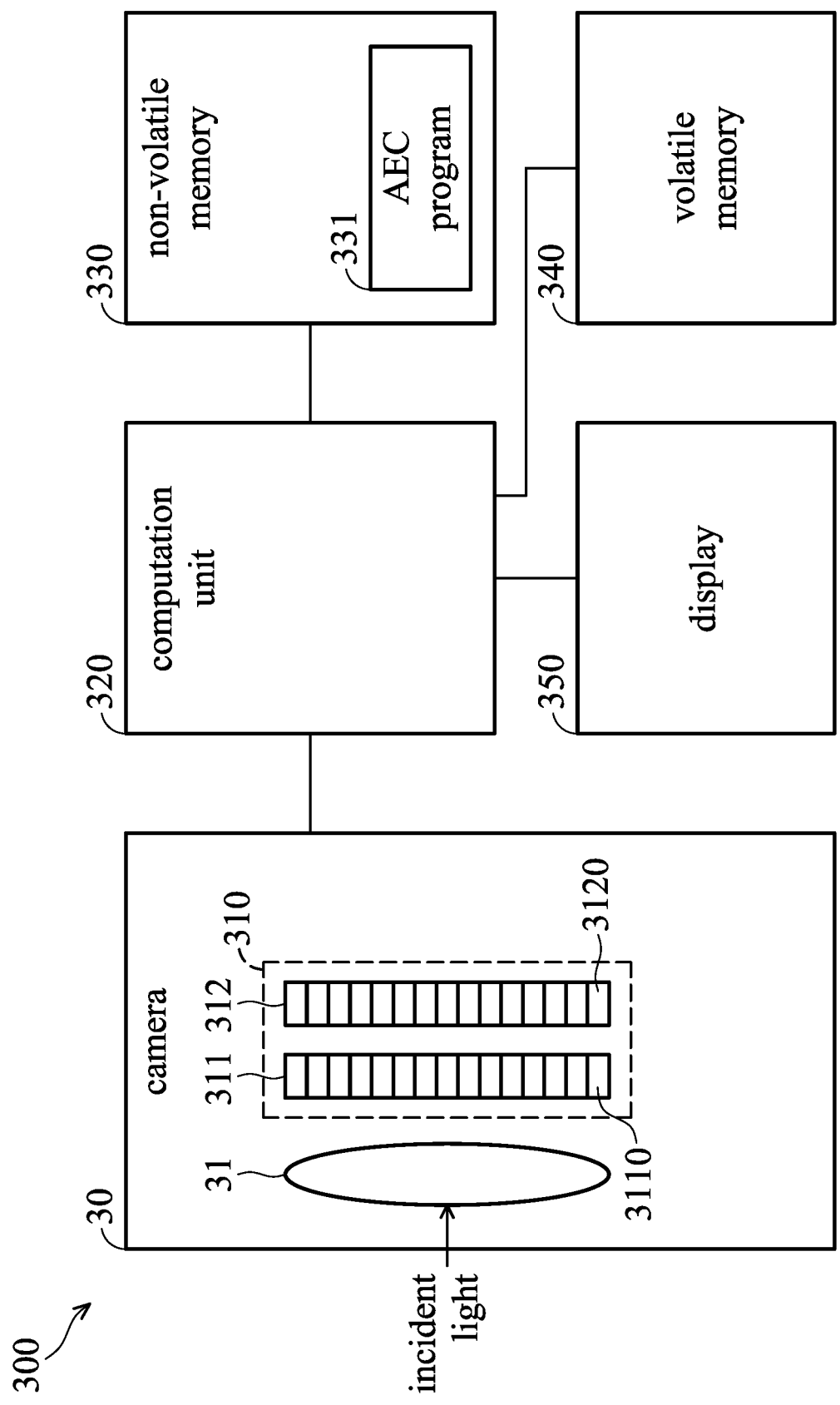
FIG. 3 is a block diagram of an electronic device in accordance with another embodiment of the disclosure.

FIG. 3 is a block diagram of an electronic device in accordance with another embodiment of the disclosure. The electronic device 300 is similar to the electronic device 200. The primary difference between the electronic devices 200 and 300 is that the camera 30 does not include an ambient light sensor, and the sensor array 312 of the image sensor 310 in the camera 311 includes light-measuring photosensitive elements (i.e., light-measuring pixels) for detecting the ambient light intensity. For example, the computation unit 220 may receive a first portion of the sensor data from the first photosensitive elements that receives incident light via red filters, green filters, and blue filters of the filter array 311, and receive a second portion of the sensor data (e.g., can be regarded as "additional information" or "ambient light information") from the second photosensitive elements that are used as dedicated light-measuring photosensitive elements via transparent or white filters of the filter array 311. Thus, the computation unit 320 may use the second portion of the sensor data to perform auto exposure control of the image sensor 310. In some embodiments, each of the second photosensitive elements may receive red light, green light, or blue light via a respective red filter, green filter, or blue filter in the filter array 311.

Figure 4A:
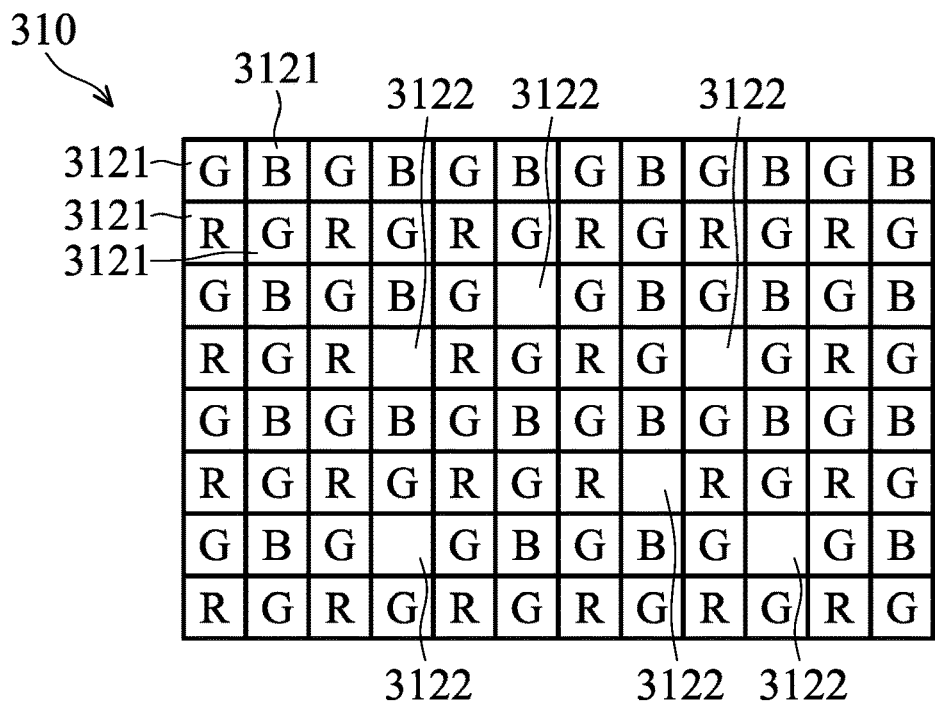
FIGS. 4A-4C are examples of the image sensor 310 in accordance with an embodiment of the disclosure.
Figure 4B:
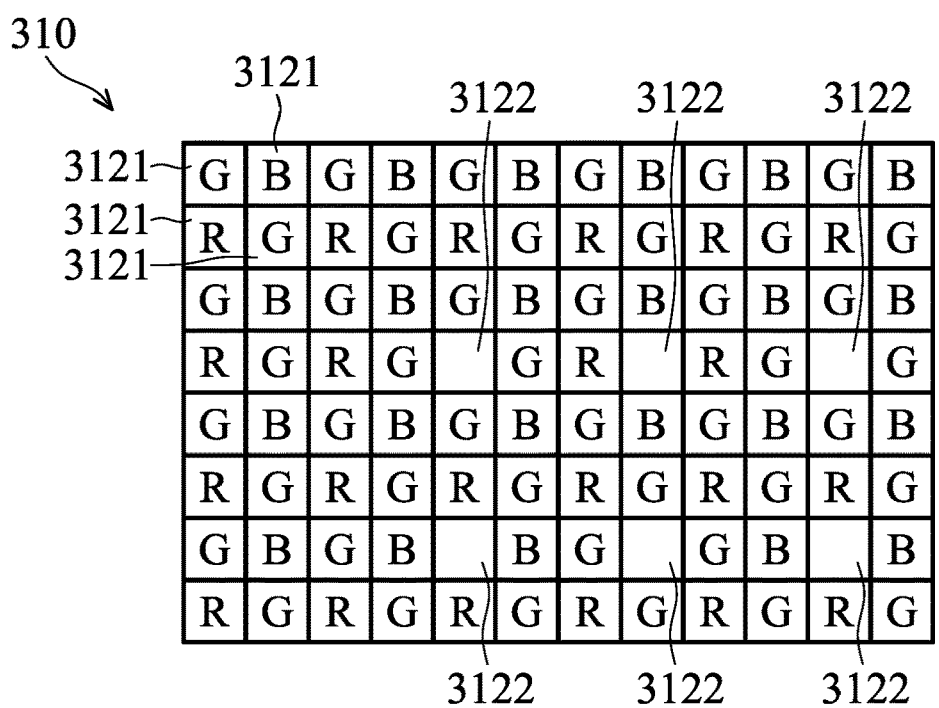
Figure 4C:
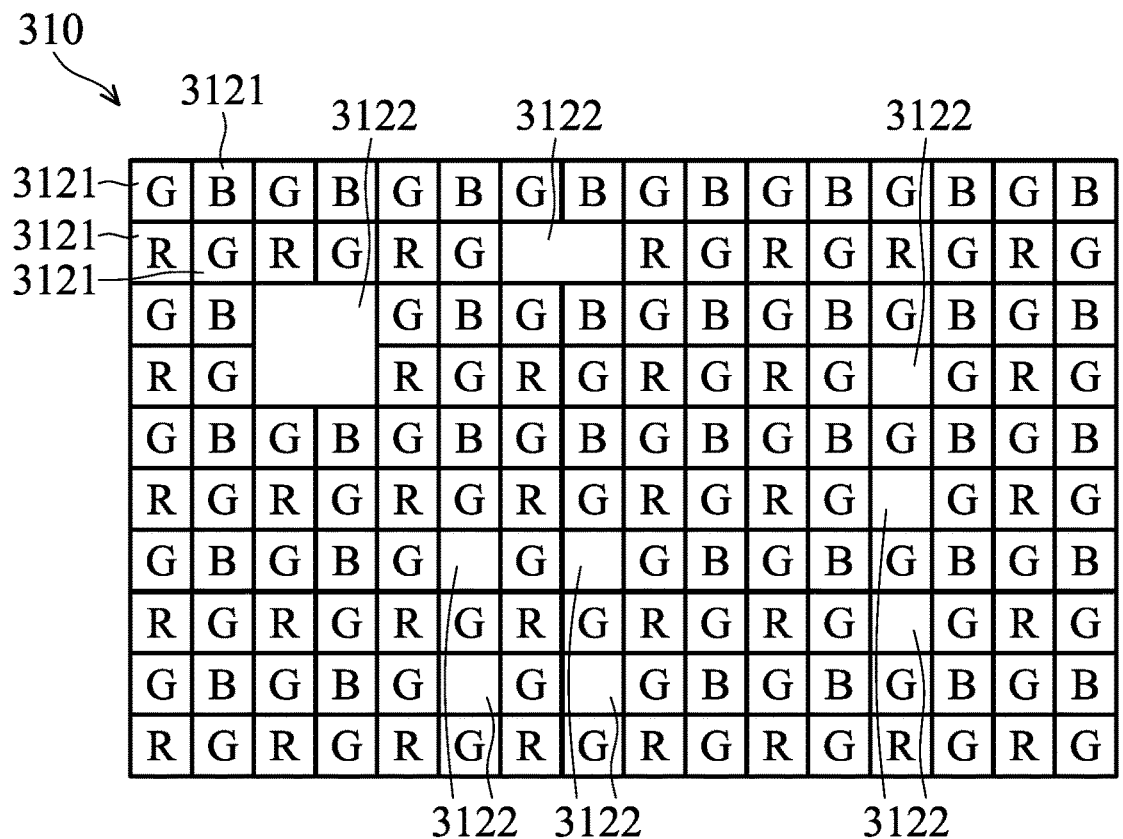

FIGS. 4A-4C are examples of the image sensor 310 in accordance with an embodiment of the disclosure. The photosensitive elements 3120 in the image sensor 310 can be classified into the first photosensitive elements (e.g., image pixels) 3121 and second photosensitive elements (e.g., light-measuring pixels) 3122. Each of the first photosensitive elements 3121 may receive the red light, green light, or blue light via a respective red filter, green filter, or blue filter in the filter array 311. The second photosensitive elements 3122 may receive white light via the transparent or white filters in the filter array 311. The second photosensitive elements 3122 can be located at any position in the image sensor 310. FIG. 4A shows an example of the locations of the light-measuring pixels in the image sensor 310, and FIG. 4B shows another example of the locations of the light-measuring pixels in the image sensor 310. Referring to FIG. 4B, a portion of the image sensor 310 is illustrated, and the pattern of the six second photosensitive elements 3122 can be repeatedly arranged in the image sensor 310.

FIG. 4C shows yet another example of the locations of the light-measuring pixels in the image sensor 310. As illustrated in FIG. 4C, each of the second photosensitive elements 3122 may be located separately or in combination to form a macro photosensitive element in the image sensor 310.

Figure 5A:
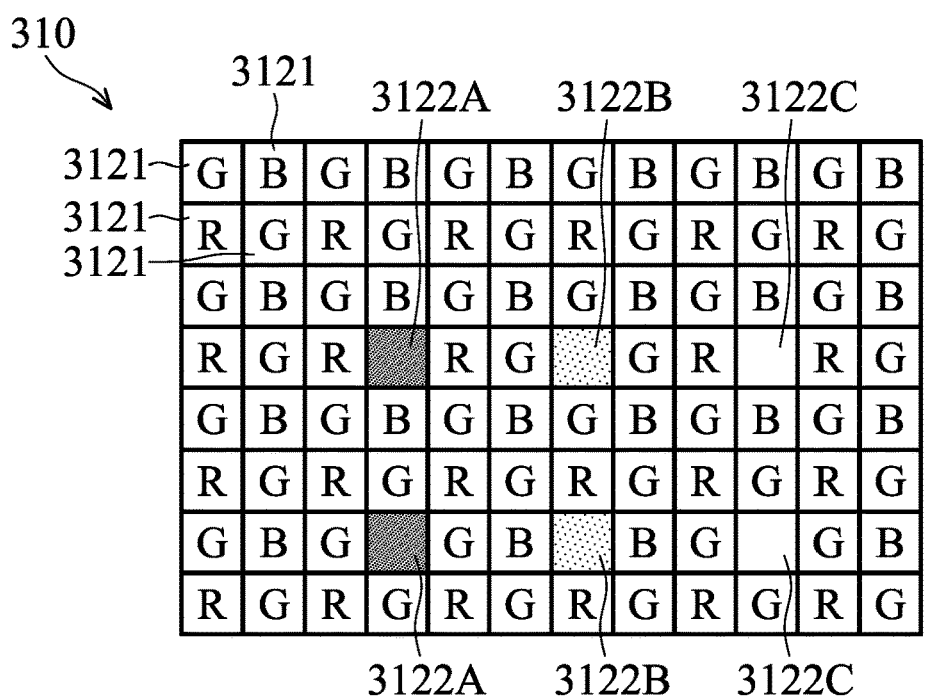
FIG. 5A shows the image sensor having light-measuring pixels with different exposure configurations in accordance with an embodiment of the disclosure.

More specifically, the light-measuring pixels in the image sensor 310 may be divided into multiple groups having different exposure configurations that are controlled by the computation unit 220. FIG. 5A shows the image sensor having light-measuring pixels with different exposure configurations in accordance with an embodiment of the disclosure.

As illustrated in FIG. 5A, the image sensor 310 includes second photosensitive elements 3122A, 3122B, and 3122C, and the second photosensitive elements 3122A, 3122B, and 3122C have different exposure configurations. For example, the second photosensitive elements 3122A have the first exposure configuration such as a short exposure value (e.g., exposure time or sensitivity), and the second photosensitive elements 3122B have the second exposure configurations such as a middle or normal exposure value, and the second photosensitive elements 3122C have the third exposure configurations such as a long exposure value.

Figure 5B:
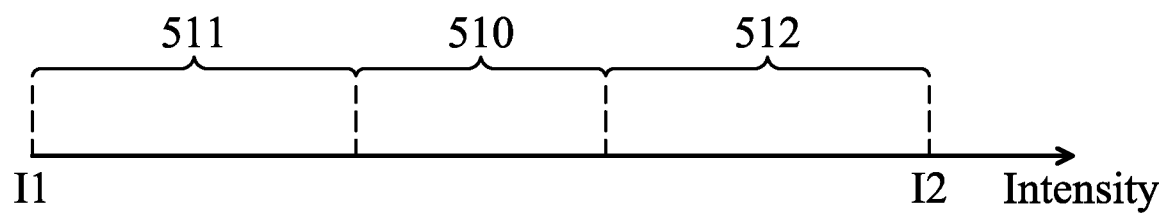
FIG. 5B shows the dynamic range of the image pixels in the image sensor in the embodiment of FIG. 5A.

FIG. 5B shows the dynamic range of the image pixels in the image sensor in the embodiment of FIG. 5A.

As illustrated in FIGS. 5B, I1 and I2 denote the minimum intensity value and the maximum intensity value that can be detected by the image sensor 310, respectively. The first photosensitive elements 3121 may have the normal exposure value, and the dynamic range of the first photosensitive elements 3121 are within the range 510 that is a very limited portion of the range between the values I1 and I2. Specifically, the range 510 denotes the valid dynamic range of the image pixels 3121. The ranges 511 and 512 denote invalid dynamic ranges of the first photosensitive elements 3121. In other words, the image pixels 3121 with the normal exposure value are not capable of detecting the intensity values that are not within the range 510.

Figure 5C:
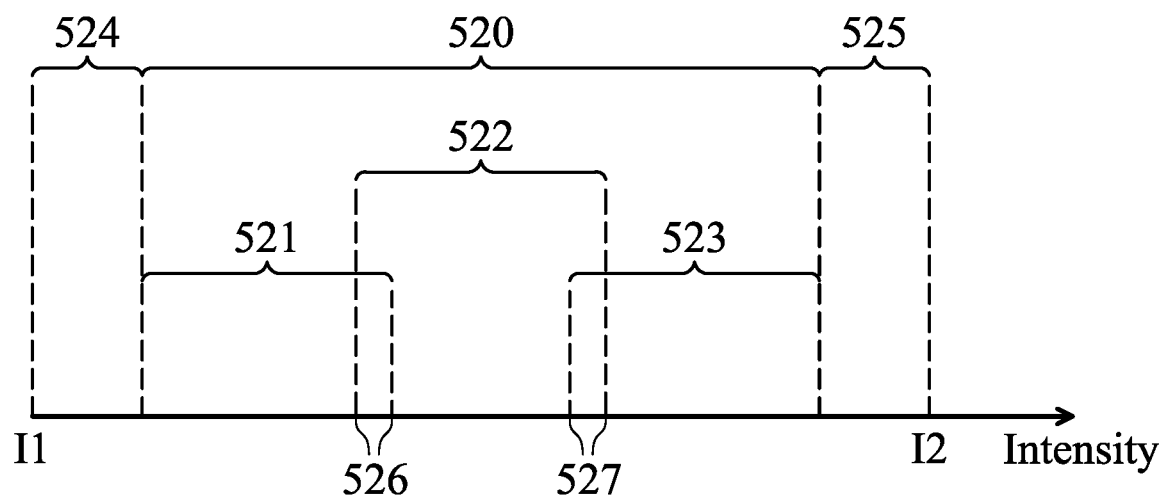
FIG. 5C shows the dynamic range of the light-measuring pixels in the image sensor in the embodiment of FIG. 5A.

FIG. 5C shows the dynamic range of the light-measuring pixels in the image sensor in the embodiment of FIG. 5A.

As illustrated in FIG. 5C, the second photosensitive elements 3122A have the short exposure value, and the dynamic range of the second photosensitive elements 3122A may be represented by the range 521. Similarly, the second photosensitive elements 3122B have the normal exposure value or another exposure value approximate to the normal exposure value, and the dynamic range of the second photosensitive elements 3122B can be represented by the range 522. The second photosensitive elements 3122C have the long exposure value, and the dynamic range of the second photosensitive elements 3122C can be represented by the range 523. It should be noted that the range 521 and the range 522 are partially overlapped at the region 526, and the range 522 and the range 523 are partially overlapped at the region 527.

Accordingly, with the second photosensitive elements 3122A, 3122B, and 3122C having different exposure values in the sensor array, the overall dynamic range of the second photosensitive elements 3122 in the image sensor 310 can be represented by the range 520. Additionally, the ranges 524 and 525 denote invalid dynamic range of the second photosensitive elements 3122A, 3122B, and 3122C.

In some embodiments, the overall dynamic range of the second photosensitive elements 3122 may be not suitable for extreme cases such as a very bright scene or a very dark scene, and thus the dynamic range of the scene may be located in the range 525 or range 524. In this situation, the computation unit 320 may calibrate the exposure value of the second photosensitive elements 3122. If the dynamic range of the scene is located in the range 525, the computation unit 320 may simultaneously reduce the exposure values of the second photosensitive elements 3122A, 3122B, and 3122C. If the dynamic range of the scene is located in the range 524, the computation unit 320 may simultaneously increase the exposure values of the second photosensitive elements 3122A, 3122B, and 3122C. After the calibration of the exposure value of the second photosensitive elements 3122A, 3122B, and 3122C, the computation unit 320 may further obtain ambient light information from the second photosensitive elements 3122A, 3122B, and 3122C again to determine whether the current exposure values of the second photosensitive elements 3122A, 3122B, and 3122C is properly set. If the current exposure values of the second photosensitive elements 3122A, 3122B, and 3122C is still not properly set, the computation unit 320 may perform iterations to calibrate the current exposure values of the second photosensitive elements 3122A, 3122B, and 3122C again until the current exposure values of the second photosensitive elements 3122A, 3122B, and 3122C is properly set.

Figure 6A:
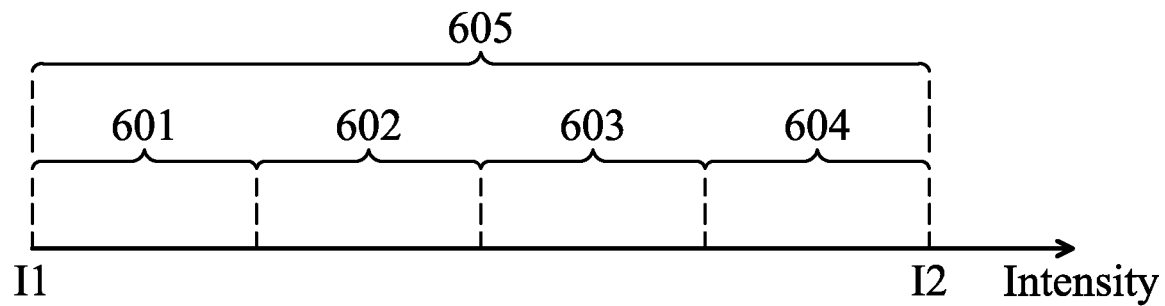
FIG. 6A and FIG. 6B are diagrams of the dynamic ranges of the light-measuring pixels having different exposure configurations in accordance with an embodiment of the disclosure.
Figure 6B:
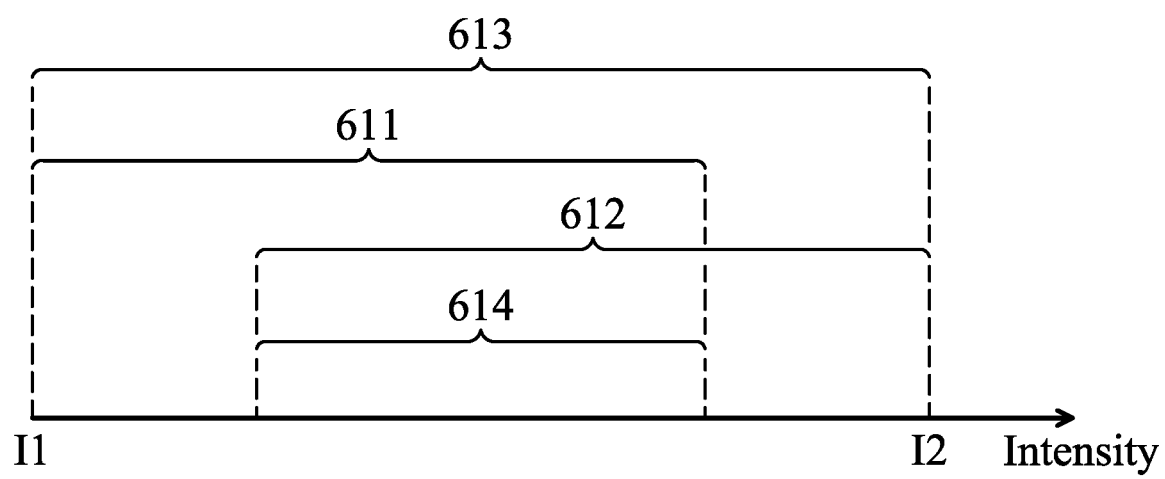

FIG. 6A and FIG. 6B are diagrams of the dynamic ranges of the light-measuring pixels having different exposure configurations in accordance with an embodiment of the disclosure. In some embodiments, the exposure value of each of the second photosensitive elements 3122 can be individually and independently controlled by the computation unit 220. Thus, the number of exposure configurations of the second photosensitive elements 3122 may vary.

As illustrated in FIG. 6A, there are four exposure configurations of the second photosensitive elements 3122 in the image sensor 310. In other words, there are four groups of the second photosensitive elements 3122, and each group has an individual exposure value. In the embodiment, the first group, the second group, the third group, and the fourth group of the second photosensitive elements 3122 have the first exposure value EV1, the second exposure value EV2, the third exposure value EV3, and the fourth exposure value EV4, respectively, where EV4>EV3>EV2>EV1, so that the dynamic range of each group covers one of the fourth of the overall dynamic range 605 between the maximum intensity I2 and the minimum intensity I1. It should be noted that the dynamic ranges 601, 602, 603, and 604 of the first, second, third, and fourth groups can be connected seamlessly and do not overlap with each other.

As illustrated in FIG. 6B, there are two exposure configurations of the second photosensitive elements 3122 in the image sensor 310. In other words, there are two groups of the second photosensitive elements 3122, and each group has an individual exposure value. In the embodiment, the first group and the second group of the second photosensitive elements 3122 have the first exposure value EV1 and the second exposure value EV2, respectively, where EV2 is larger than EV1. The dynamic range 611 of the first group covers the first portion of the overall dynamic range 613, and the dynamic range 612 covers the second portion of the overall dynamic range 613. However, the dynamic ranges 611 and 612 are partially overlapped at the region 614.

Specifically, since the overall dynamic range of the second photosensitive elements 3122 (e.g., second photosensitive elements) is wider than that of the image pixels (e.g., first photosensitive elements) of the sensor array 312, the second photosensitive elements 3122 may still detect correct ambient light intensity in some extreme cases such as an extremely dark scene or an extremely bright scene while the image pixels in the image sensor 310 is unable to handle these extreme cases due to underexposure or overexposure. In addition, the second photosensitive elements 3122 are embedded into the sensor array 312, and thus the computation unit 320 may receive the sensor data from the first photosensitive elements (e.g., image pixels) 3121 and the second photosensitive elements (light-measuring pixels) 3122 of the image sensor 310 at the same time. When compared with the hardware configuration in FIG. 2, there is no synchronization issue (i.e., time delay) between the image data and the ambient light information, and no additional external ambient light sensor is required using the hardware configuration in FIG. 3.

Furthermore, since the second photosensitive elements 3122 can be distributed into any location of the sensor array, the ambient light information detected by the second photosensitive elements 3122 may cover the whole field of view (FoV) of the image sensor 310.

Figure 7A:
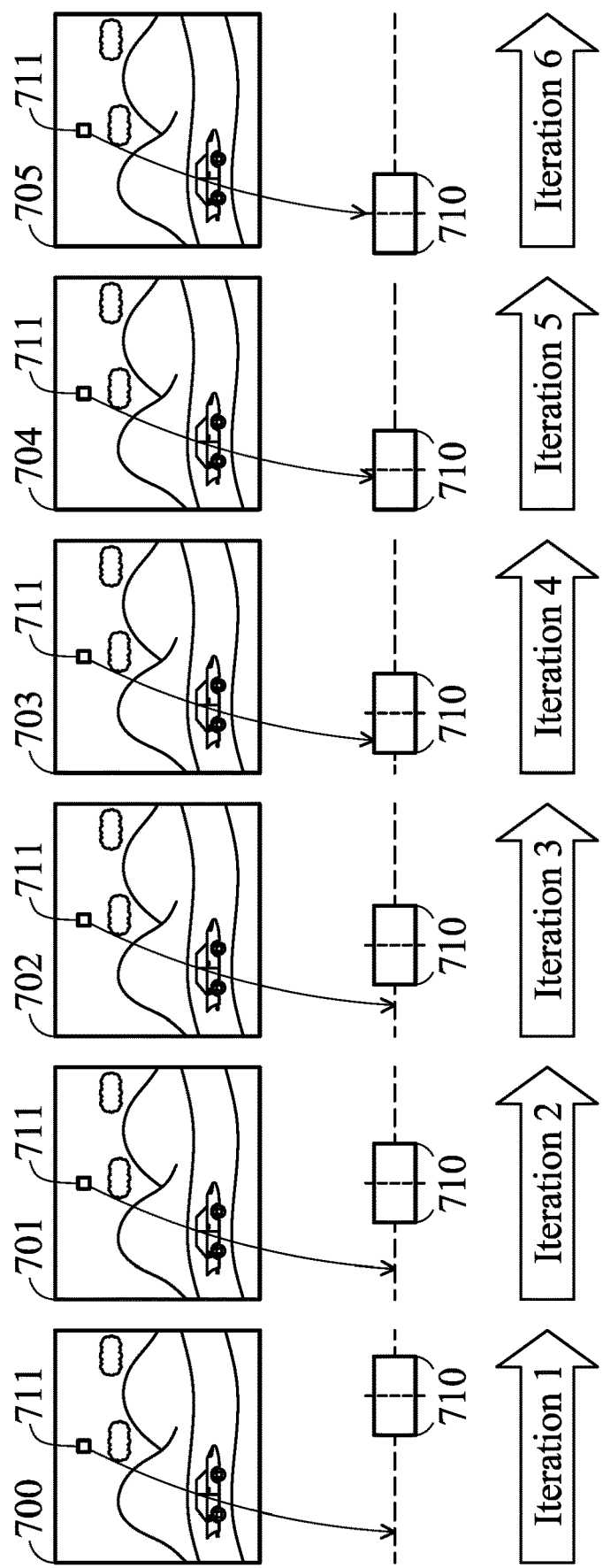
FIG. 7A is a diagram showing iterations of the auto exposure control program using an image sensor without light-measuring pixels or an ambient light sensor.

FIG. 7A is a diagram showing iterations of the auto exposure control program using an image sensor without light-measuring pixels or an ambient light sensor. In a conventional electronic device having an image sensor without light-measuring pixels or an ambient light sensor, the computation unit 320 has to predict the next exposure value of the image sensor after completing an iteration of the auto exposure control program. For example, an iteration of the AEC program of the conventional electronic device may indicate that the computation unit first controls the camera to capture an image of the current scene, and then predict the next exposure of the image sensor using the information of the captured image. Since there may be dark portions and bright portions in the same scene, it may be difficult for the conventional electronic device to precisely predict the exposure value for "well exposure" of the scene after completing an AEC iteration.

For example, referring to FIG. 7A, the range 710 denotes the dynamic range of the image sensor without light-measuring pixels. When the calculated intensity value (or a determination value) of image 700 by the AEC program (e.g. a single estimator 711 is used) falls on the center of the range 710, it will be regarded as "well exposure" using the current exposure value.

At Iteration 1, the computation unit may determine that the initial exposure value of the image sensor is a wrong guess by analyzing the captured image (e.g., using the histogram of the captured image) with the initial exposure value. For example, the calculated intensity value (or a determination value) of the captured image 701 is far beyond the range 710 using the initial exposure value. Thus, the computation unit may use a shorter exposure value at the next iteration.

At Iteration 2, the computation unit may determine that the current exposure value of the image sensor is a wrong guess by analyzing the captured image using the exposure value guessed at Iteration 1. For example, the calculated intensity value (or a determination value) of the captured image 702 is still beyond the range 710 using the exposure value guessed at Iteration 1. Thus, the computation unit may guess another shorter exposure value to be used at the next iteration.

At Iteration 3, the computation unit may determine that the current exposure value of the image sensor is a wrong guess by analyzing the captured image using the exposure value guessed at Iteration 2. For example, the calculated intensity value (or a determination value) of the captured image 703 is very close to the range 710 using the exposure value guessed at Iteration 2. Thus, the computation unit may guess another shorter exposure value to be used at the next iteration.

At Iteration 4, the computation unit may determine that the current exposure value of the image sensor is a better guess by analyzing the captured image using the exposure value guessed at Iteration 3. For example, the calculated intensity value (or a determination value) of the captured image 704 falls on the range 710 using the exposure value guessed at Iteration 3. However, the exposure value used in Iteration 4 is still not for "well exposure", and the computation unit may calculate the exposure value for "well exposure" at the next iteration.

At Iteration 5, the computation unit may determine that the current exposure value of the image sensor is a better guess by analyzing the captured image using the exposure value guessed at Iteration 4. For example, the calculated intensity value (or a determination value) of the captured image 705 falls on the range 710 and is very close to the center of the range 710 using the exposure value guessed at Iteration 4. The computation unit may fine-tune the exposure value for "well exposure" at the next iteration.

At Iteration 6, the computation unit may determine that the current exposure value of the image sensor is the best guess by analyzing the captured image using the exposure value guessed at Iteration 5, For example, the calculated intensity value (or a determination value) of the captured image 706 exactly falls on the center of the range 710 using the exposure value guessed at Iteration 5. It indicates that the current exposure value is for "well exposure". Thus, the procedure of auto exposure control is completed.

Figure 7B:
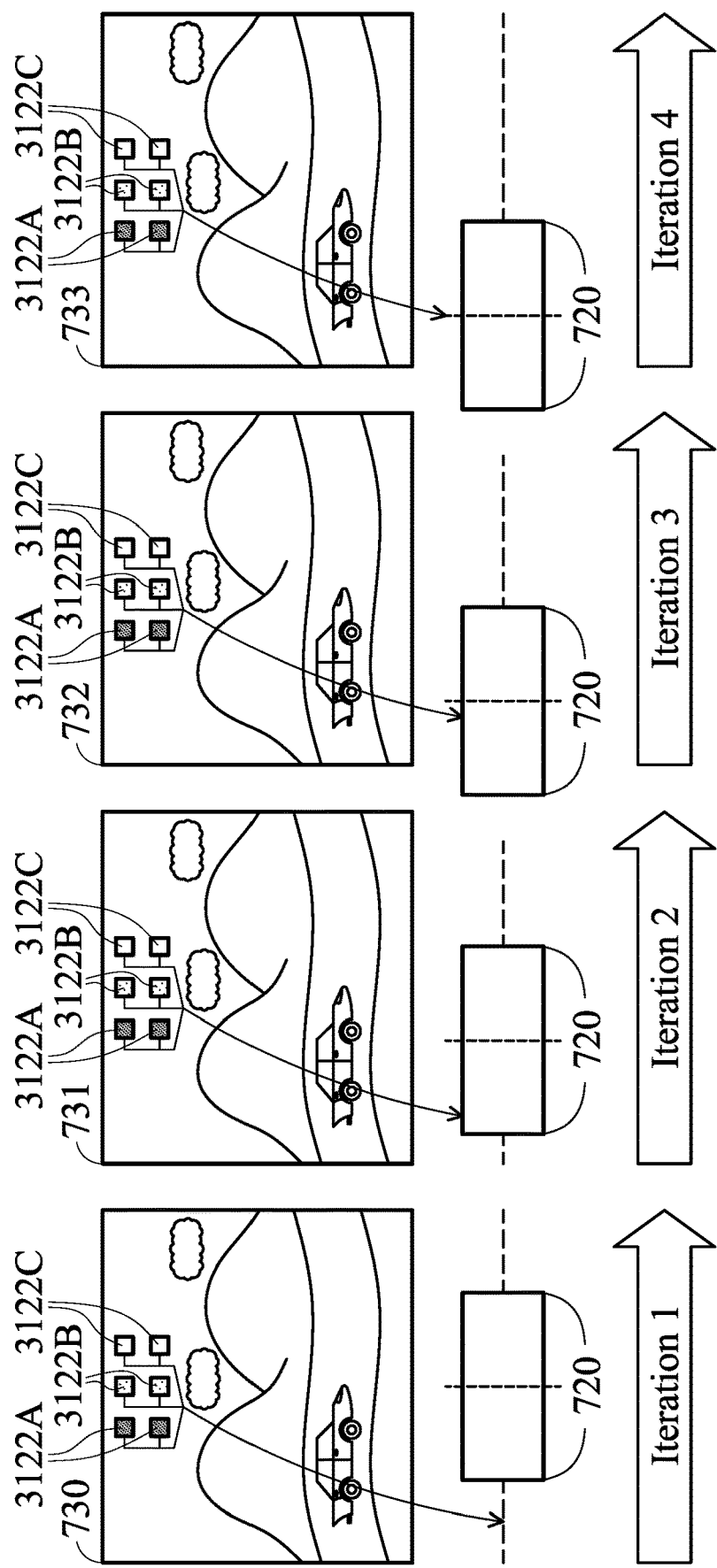
FIG. 7B is a diagram showing iterations of the auto exposure control program with the image sensor with light-measuring pixels in accordance with an embodiment of the disclosure.

FIG. 7B is a diagram showing iterations of the auto exposure control program with the image sensor with light-measuring pixels in accordance with an embodiment of the disclosure. Referring to FIG. 7B, the range 720 denotes the overall dynamic range of the second photosensitive elements 3122 (i.e., including second photosensitive elements 3122A, 3122B, and 3122C) in the image sensor 310. When the calculated intensity value falls on the center of the range 720, it will be regarded as "well exposure" using the current exposure value. It should be noted that the dynamic range of the image sensor 310 is much wider than that of the image sensor in FIG. 7A.

At Iteration 1, the computation unit 320 may determine that the initial exposure value of the image sensor 310 is a wrong guess by analyzing the captured image (e.g., using the histogram and/or distribution of pixels of the captured image) with the initial exposure value. For example, the calculated intensity value (or a determination value) of the captured image 730 by the AEC program 331 (e.g. using second photosensitive elements 3122A, 3122B, and 3122C) is beyond the range 720 using the initial exposure value. Thus, the computation unit 320 may use a shorter exposure value than the initial exposure value at the next iteration.

At Iteration 2, the computation unit 320 may determine that the current exposure value of the image sensor 310 is a better guess by analyzing the captured image using the exposure value guessed at Iteration 1. For example, the calculated intensity value (or a determination value) of the captured image 731 falls on the range 720 using the exposure value guessed at Iteration 1. However, the exposure value used in Iteration 2 is still not for "well exposure", and the computation unit 320 may calculate the exposure value for "well exposure" at the next iteration.

At Iteration 3, the computation unit 320 may determine that the current exposure value of the image sensor 310 is a better guess by analyzing the captured image using the exposure value guessed at Iteration 2. For example, the calculated intensity value (or a determination value) of the captured image 732 falls on the range 720 and is very close to the center of the range 720 using the exposure value guessed at Iteration 2. The computation unit 310 may fine-tune the exposure value for "well exposure" at the next iteration.

At Iteration 4, the computation unit 320 may determine that the current exposure value of the image sensor 310 is the best guess by analyzing the captured image 733 using the exposure value guessed at Iteration 3, For example, the calculated intensity value (or a determination value) of the captured image exactly falls on the center of the range 720 using the exposure value guessed at Iteration 3. It indicates that the current exposure value is for "well exposure". Thus, the procedure of auto exposure control is completed.

Specifically, with the image sensor 310 having light-measuring pixels of the present application, less iterations are required for completing the auto exposure control procedure because the light-measuring pixels may obtain more information in the underexposure and overexposure environments due to a wider overall dynamic range of the light-measuring pixels. Additionally, the pattern of the second photosensitive elements 3122 having different exposure configurations as shown in FIG. 4B are repeatedly arranged in the image sensor 310, and thus the ambient light information obtained from the second photosensitive elements 3122 is less likely mislead by a partially bright or dark scene, and thus it is easier for the computation unit 320 to make a better guess of the exposure value for the next iteration.

Figure 8A:
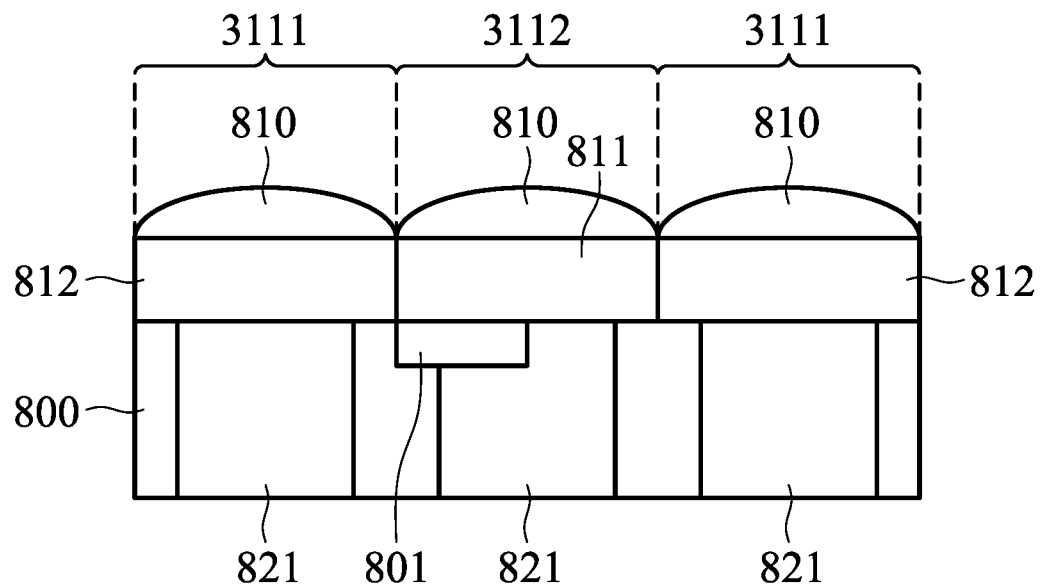
FIGS. 8A-8C are diagrams of different implementations of the light-measuring pixel in the image sensor in accordance with an embodiment of the disclosure.
Figure 8B:
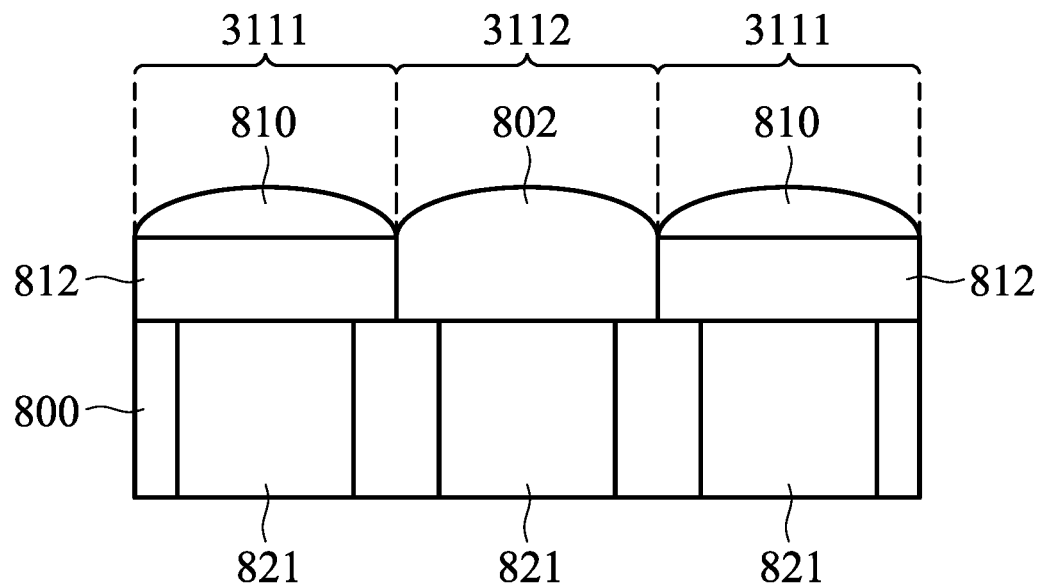
Figure 8C:
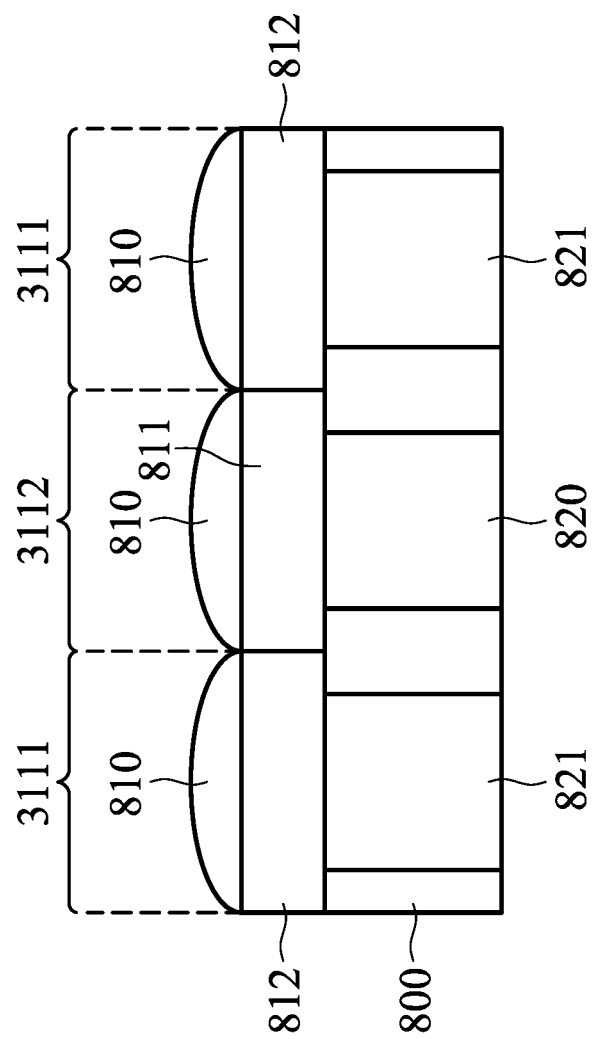

FIGS. 8A-8C are diagrams of different implementations of the light-measuring pixel in the image sensor in accordance with an embodiment of the disclosure.

There are various ways to implement each of the second photosensitive elements 3122 in the image sensor 310 to alternate its sensitivity or dynamic range. As illustrated in FIG. 8A, a blocking element 801 is implemented on the substrate 800 to cover a portion of the photosensitive element of the light-measuring pixel 3122, so that the remaining portion of the photosensitive element may receive the incident light via the lens 810 and the white filter 811. Thus, the architecture of the light-measuring pixel 3122 in FIG. 8A may have a lower sensitivity, and can be used for the overexposure environment.

Alternatively, as illustrated in FIG. 8B, a macro lens or filter 802 (compared with lenses 810 and filters 812) is implemented on the photosensitive element of the light-measuring pixel 3122. Thus, the architecture of the light-measuring pixel 3122 in FIG. 8A may have a higher sensitivity.

Alternatively, as illustrated in FIG. 8C, the light-measuring pixel 3122 has a different photosensitive element 820 implemented within the substrate 800. For example, the photosensitive element 820 has a wider dynamic range than the photosensitive element 821 of the image pixels 3121 of the image sensor 310.

It should be noted that the architectures of the light-measuring pixel described in the embodiments of FIGS. 8A-8C can be used individually or in combination in the image sensor 310.

Figure 9:
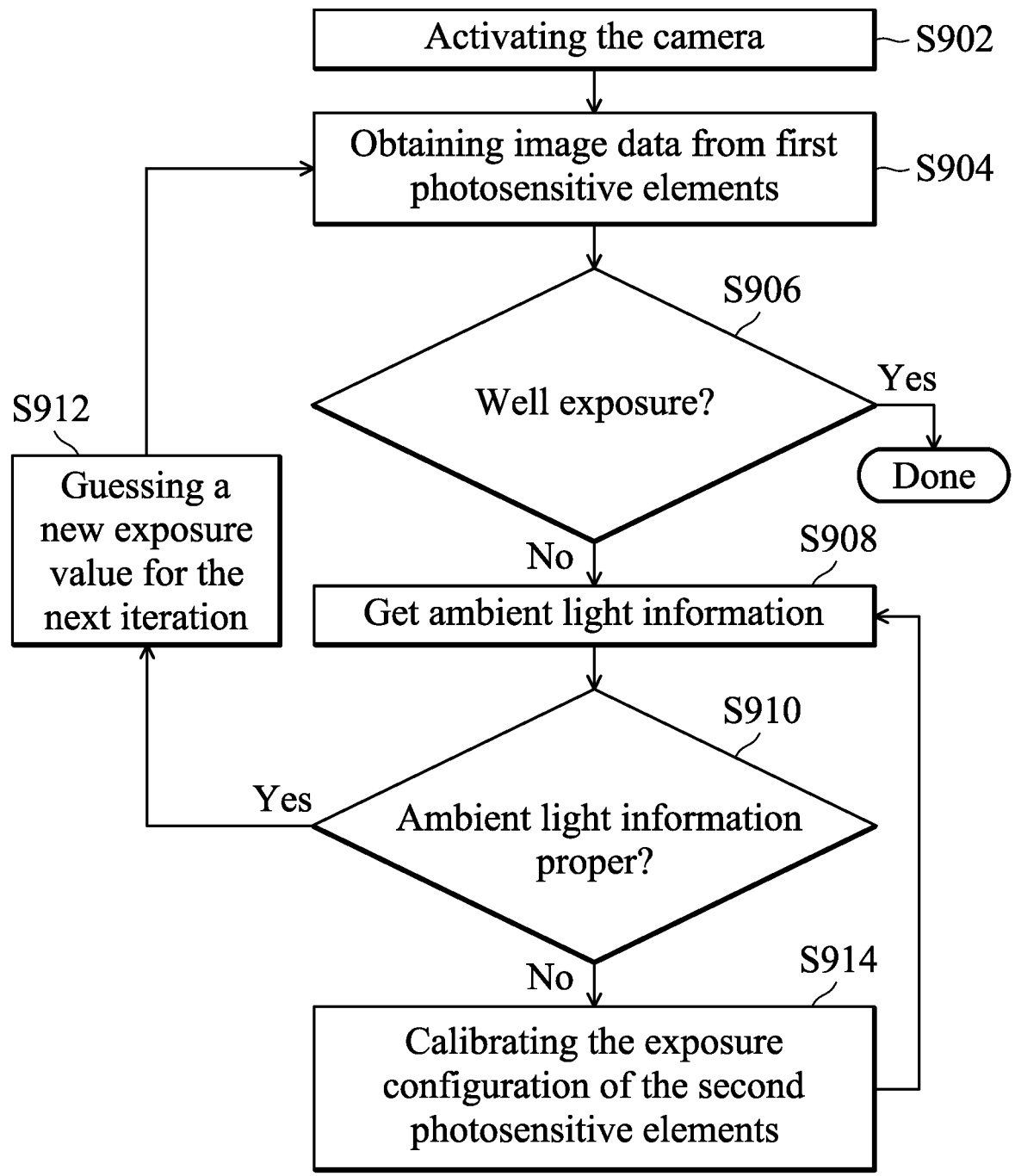
FIG. 9 is a flow chart of a method of automatic exposure control (AEC) for a camera of an electronic device in accordance with an embodiment of the disclosure.

FIG. 9 is a flow chart of a method of automatic exposure control (AEC) for a camera of an electronic device in accordance with an embodiment of the disclosure.

In step S902, the camera 30 is activated.

In step S904, the camera 30 is used to capture an image of a scene. For example, the capture image includes the pixel data of the image pixels 3121 and second photosensitive elements 3122 in the image sensor 310.

In step S906, it is determined whether the captured image satisfies a predetermined exposure criterion. If so, the flow ends, and the auto exposure control procedure is completed. If not, step S908 is performed. In some embodiments, the predetermined exposure criterion may denote the captured image is well exposed. For example, the computation unit 320 may calculate the histogram of the captured image to determine whether the exposure of the captured image is correctly set. Specifically, the computation unit 320 may analyze the number of underexposed or overexposed pixels in the captured image to determine whether the captured image is well exposed using the current exposure value. For example, when the number of the underexposed pixels (e.g., with intensities close to zero) and/or overexposed pixels (e.g., with intensities close to 255) in the captured image is less than a predefined number, the computation unit 320 may determine that the captured image satisfies the predetermined exposure criterion which indicates that the captured image is well exposed.

In step S908, the ambient light information of the camera is retrieved from the second photosensitive elements 3122 of the image sensor 310.

In step S910, the computation unit 320 determines whether the retrieved ambient light information is proper. If the retrieved ambient light information is proper, step S912 is performed. If the retrieved ambient light information is not proper, step S914 is performed. Specifically, as described in the embodiment of FIG. 5C, the computation unit 320 may determine whether the current (or default) exposure values for the second photosensitive elements 3122A, 3122B, and 3122C are properly set. If the current exposure values of the second photosensitive elements 3122A, 3122B, and 3122C is still not properly set, the computation unit 320 may perform iterations to calibrate the current exposure values of the second photosensitive elements 3122A, 3122B, and 3122C again until the current exposure values of the second photosensitive elements 3122A, 3122B, and 3122C is properly set (i.e., all the second photosensitive elements are not saturated using the current exposure configuration).

In step S912, the computation unit 320 guesses a new exposure value for the next iteration, and then step S904 is performed to capture new image data with the new exposure value.

In step S914, the computation unit 320 calibrates an exposure configuration of the second photosensitive elements 3122, and performs step S908 to retrieve the ambient light information from the second photosensitive elements 3122 again using the calibrated exposure configuration.

In view of the above, an image sensor and a method of automatic exposure control of a camera are provided. The image sensor has embedded light-measuring pixels to detect ambient light information of the camera, and the iterations required for the auto exposure control may be reduced with the help of ambient light information. Additionally, image data detected by the image pixels and the ambient light information detected by light-measuring pixels in the image sensor can be simultaneously received by the computation unit, and thus no additional resources is required for synchronizing the image data and the ambient light information.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus, comprising:
a processor configured to perform operations comprising:
receiving, from a sensor array of an image sensor, data sensed by the sensor array, the sensed data comprising image data and ambient light information, wherein the ambient light information is sensed by a plurality of light-measuring pixels in the sensor array that are divided into a plurality of groups, wherein each of the groups is located at a predefined location;
determining whether the image data matches a predetermined exposure criterion; and
in response to the image data not matching the predetermined exposure criterion, obtaining the ambient light information from the sensed data; and
selectively configuring a new exposure value for a plurality of imaging pixels in the image sensor to capture new image data according to the obtained ambient light information.

2. The apparatus as claimed in claim 1, wherein the image sensor further comprises a color filter array (CFA) such that each of a plurality of image pixels is aligned with a respective filter of the CFA to receive red light, green light, or blue light, and each of the light-measuring pixels is aligned with a respective white/transparent filter of the CFA to receive white light.

3. The apparatus as claimed in claim 1, wherein each of the groups in the light-measuring pixels has a respective exposure value that is different from the others.

4. The apparatus as claimed in claim 2, wherein each pixel in the sensor array has a first dynamic range, and the processor further obtains the ambient light information having a second dynamic range from the groups of the light-measuring pixels, wherein the second dynamic range is wider than the first dynamic range.

5. The apparatus as claimed in claim 4, wherein a first group, a second group, and a third group in the plurality of groups has a third dynamic range, and a fourth dynamic range, and a fifth dynamic range, respectively, wherein the third dynamic range, the fourth dynamic range, and the fifth dynamic range form the second dynamic range, wherein the third dynamic range is partially overlapped with the fourth dynamic range, and the fourth dynamic range is partially overlapped with the fifth dynamic range.

6. The apparatus as claimed in claim 1, wherein the dynamic range of each light-measuring pixel is wider than that of each imaging pixel.

7. The apparatus as claimed in claim 1, wherein the processor controls an exposure value of each of the light-measuring pixels independently.

8. The apparatus as claimed in claim 1, wherein the processor is further configured to determine whether the obtained ambient light information matches a predetermined condition.

9. The apparatus as claimed in claim 8, wherein the processor is further configured to configure the new value for the plurality of imaging pixels in the image sensor to capture the new image data in response to the obtained ambient light information matching the predetermined condition, wherein the processor is further configured to adjust exposure configurations of the plurality of light-measuring pixels in the image sensor to estimate the ambient light information again in response to the obtained ambient light information not matching the predetermined condition.

10. A method of automatic exposure control (AEC) for a camera, wherein the camera comprises an image sensor, the method comprising:
   receiving, from a sensor array of the image sensor, data sensed by the sensor array, the sensed data comprising image data and ambient light information;
   sensing the ambient light information by a plurality of light-measuring pixels in the sensor array that are divided into a plurality of groups, wherein each of the groups is located at a predefined location;
   determining whether the image data matches a predetermined exposure criterion;
   in response to the image data not matching the predetermined exposure criterion, obtaining the ambient light information from the sensed data; and
   selectively configuring a new exposure value for a plurality of imaging pixels in the image sensor to capture new image data according to the obtained ambient light information.

11. The method as claimed in claim 10, wherein the image sensor further comprises a color filter array (CFA) such that each of a plurality of image pixels is aligned with a respective filter of the CFA to receive red light, green light, or blue light, and each of the light-measuring pixels is aligned with a respective white/transparent filter of the CFA to receive white light.

12. The method as claimed in claim 10, wherein each of the groups in the light-measuring pixels has a respective exposure value that is different from the others.

13. The method as claimed in claim 10, wherein each pixel in the sensor array has a first dynamic range, and the method further comprises: obtaining the ambient light information having a second dynamic range from the groups of the light-measuring pixels, wherein the second dynamic range is wider than the first dynamic range.

14. The method as claimed in claim 13, wherein a first group, a second group, and a third group in the plurality of groups has a third dynamic range, and a fourth dynamic range, and a fifth dynamic range, respectively, wherein the third dynamic range, the fourth dynamic range, and the fifth dynamic range form the second dynamic range, wherein the third dynamic range is partially overlapped with the fourth dynamic range, and the fourth dynamic range is partially overlapped with the fifth dynamic range.

15. The method as claimed in claim 10, wherein the dynamic range of each light-measuring pixel is wider than that of each imaging pixel.

16. The method as claimed in claim 10, further comprising:
   controlling an exposure value of each of the light-measuring pixels independently.

17. The method as claimed in claim 10, further comprising: determining whether the obtained ambient light information matches a predetermined condition.

18. The method as claimed in claim 17, further comprising: in response to the obtained ambient light information matching the predetermined condition, configuring the new exposure value for the plurality of imaging pixels in the image sensor to capture the new image data; and in response to the obtained ambient light information not matching the predetermined condition, adjusting exposure configurations of the plurality of light-measuring pixels in the image sensor to estimate the ambient light information again.

* * * * *